United States Patent [19]

Takemae et al.

[11] 4,447,745
[45] May 8, 1984

[54] BUFFER CIRCUIT INCLUDING A CURRENT LEAK CIRCUIT FOR MAINTAINING THE CHARGED VOLTAGES

[75] Inventors: Yoshihiro Takemae; Seiji Enomoto, both of Yokohama; Shigeki Nozaki, Kawasaki; Tsutomu Mezawa, Aizuwakamatsu; Katsuhiko Kabashima, Kawasaki, all of Japan

[73] Assignee: Fujitsu Limited, Kawasaki, Japan

[21] Appl. No.: 322,719

[22] Filed: Nov. 18, 1981

[30] Foreign Application Priority Data

Nov. 19, 1980 [JP] Japan ................................. 55-162889

[51] Int. Cl.³ .................... H03K 5/135; H03K 19/017; H03K 19/096
[52] U.S. Cl. .................................... 307/269; 307/578; 307/601
[58] Field of Search ............................... 307/481–482, 307/443, 491, 549–550, 577–578, 583–584, 264, 269, 591, 601, 605, 518

[56] References Cited
U.S. PATENT DOCUMENTS 4,061,933 12/1977 Schroeder et al. ............. 307/481 X
4,239,990 12/1980 Hong et al. ..................... 307/550 X
4,354,123 10/1982 Eaton, Jr. ....................... 307/482 X Primary Examiner—Larry N. Anagnos
Assistant Examiner—David R. Hudspeth
Attorney, Agent, or Firm—Staas & Halsey

[57] ABSTRACT

A semiconductor circuit used as a buffer circuit having an input stage circuit for receiving an input clock signal and an inverted input clock signal, a bootstrap circuit including a transistor for receiving the output of the input stage circuit and for maintaining the gate voltage of the transistor at a high level during the standby period, and an output circuit, including a transistor which is switched on and off by the output of the bootstrap circuit, for generating an output clock signal; the semiconductor circuit further comprising a current leak circuit for maintaining, during the standby period, the voltage of a point in the semiconductor circuit which is charged during the standby period at the value corresponding to the voltage of the power source, whereby the delay of the output clock signal, caused of the fluctuation by the voltage of the power supply during the standby period, is improved and then the high speed access time in the dynamic memory is carried out.

8 Claims, 12 Drawing Figures

BUFFER CIRCUIT INCLUDING A CURRENT LEAK CIRCUIT FOR MAINTAINING THE CHARGED VOLTAGES

BACKGROUND OF THE INVENTION

1. Field of the Invention

The present invention relates, for example, to a semiconductor circuit used as a buffer circuit having the function of compensating a power source fluctuation and used for the amplification of a clock signal of a dynamic memory.

2. Description of the Prior Art

One of the conventional buffer circuits which amplifies an input clock signal $\phi_0$ (hereinafter clock $\phi_0$) (conversion of impedance) and supplies an output clock signal $\phi_1$ (hereinafter clock $\phi_1$) is constituted of MOS transistors Q1 through Q12 (Q9 is a MOS capacitor), as shown in FIG. 1. The input stage of the buffer circuit is a delay circuit constituted of the transistor Q1 through Q4. During the standby period the delay circuit holds the voltage of the node N2 which connects the source of transistor Q3 with the drain of transistor Q4 at a high level by using the input clock $\phi_0$ and the inverted input clock signal $\overline{\phi_0}$ (hereinafter clock $\overline{\phi_0}$). The clock $\phi_0$ is at a high level during the active period and is at a low level during the standby period. The clock $\overline{\phi_0}$, because of the inverted polarity, is at a low level during the active period and is at a high level during the standby period. These clocks turn off the transistor Q1, turn on the transistors Q2 and Q3, hold the node N1 at a low level, which node N1 connects the source of the transistor Q1 with the drain of the transistor Q2 and the gate of the transistor Q4, turn off the transistor Q4, and charge the node N2 to the voltage of (Vcc−Vth) through the transistor Q3 during the standby period. The Vcc is the voltage of the high voltage side in the power source and is usually 5 volts, which is the standard value allowing for an error of ±10%. The Vth is a threshold value of the transistor. Since the gate of the transistor Q5 is connected to the power source Vcc, when the node N2 is charged to the voltage of (Vcc−Vth), the node N3 is charged to the same voltage. The node N3, which connects the transistor Q5 with the gate of transistor Q6, is the gate terminal of the transistor Q6 in the bootstrap circuit, including the transistors Q6 and Q7. By charging the node N3 to a high level during the standby period, the charged voltage of the node N3 drives, at a high speed, the output stage, including the transistor Q8 through Q12, at the next active period. Since the clock $\overline{\phi_0}$ is at the high level during the standby period, the transistor Q7 turns on, the node N4 which connects the source of transistor Q6 with the drain of the transistor Q7 and MOS capacitor Q9 and the gate of transistor Q11, turns to a low level, the transistors Q8 and Q11 turn off, the transistors Q10 and Q12 turn on, and the output clock $\phi_1$ is at the low level, which is equal to the low level side of the power source Vss (usually ground voltage).

Entering in the active period the input clock $\phi_0$ and $\overline{\phi_0}$ are inverted. In FIG. 2, waveforms of the operation are shown during the active period, and this example shows the case of the constant Vcc which is equal to 4.5 volts. Since, in this example, the voltage of the node N2 is equal to the voltage of the node N3 and the voltages of these nodes are (4.5 volts−Vth), when the clock $\overline{\phi_0}$ is changed from Vcc to Vss and the clock $\phi_0$ is raised from Vss to Vcc, the voltage of the node 3 rises more than (Vcc+Vth) and the voltage to the node N4 is charged to the voltage of $\phi_0$, which is equal to Vcc, by the bootstrap effect, which is caused by the effects of the capacity between the gate and the drain of the transistor Q6 and between the gate and the source of the transistor Q6.

This results in the transistors Q8 and Q11 being turned on. At the same time, since the transistor Q1 turns on, the transistor Q2 turns off; the node N1 is charged up and the transistor Q4 turns on; then the voltage of the node N2 begins the decrease. Accordingly, the electric charges on the node N3 are deprived through the transistor Q5 and the voltage of the nodes N3 and N2 decreases to the voltage of Vss. When the voltage of the node N2 falls to a voltage of (Vss+Vth) the transistors Q10 and Q12 turn off and the voltage of the node N5 rises up to the voltage of Vcc. At this time, since the voltage of the node N4 is raised to more than (Vcc+Vth) through the capacitor Q9, the output clock $\phi_1$ rises to the maximum voltage level Vcc.

The above-mentioned operation is carried out when no fluctuation of the power source occurs, while, as shown in FIG. 3, if the fluctuation of the power source occurs during the standby period, the output clock $\phi_1$ is delayed, and delay of the output clock $\phi_1$ creates a defect. In FIG. 3, the example is shown in which the voltage of the Vcc decreases from 5.5 volts (Vcc(U)) to 4.5 volts (Vcc(L)) during the standby period. The above-mentioned fluctuation occurs or the fluctuation of other devices connected to the power source occur because the electrical constitution of the constant voltage power supply is simplified, thereby causing a decrease in the production cost. During the standby period, the voltage of the clock $\phi_0$ is low, the voltage of the clock $\overline{\phi_0}$ is high and the voltage of Vcc is 5.5 volts, causing both the nodes N2 and N3 to be charged up to the voltage of (5.5 volts−Vth). Further, if the voltage of Vcc decreases to the voltage of 4.5 volt during the standby period, the voltages of the nodes N2 and N3 (5.5 volts−Vth) do not change because there is no discharge path. The reason there is no discharge path is that the transistor Q4 holds off, and the Q3 goes to off state because the gate voltage of Q3 goes to 4.5 volts from 5.5 volts with the power source fluctuation. When the holding of the voltages of the nodes N2 and N3 is effected, the rising of the clock $\phi_1$ is delayed. In order to raise the clock $\phi_1$, it is necessary that the transistors Q10 and Q12 are turned off; on the other hand it takes time for the voltage of the node N2 to fall to the low level at which the transistors Q10 and Q12 are turned off, because the voltage of the node N2 is 1 volt higher than the voltage of (4.5 volts−Vth) in FIG. 2. During the delay time when the voltage is falling from the node N2, the delay of the rising of the clock $\phi_1$ occurs. In FIG. 3 the waveforms indicated by lines N2', N3', N5' and $\phi_1'$ show the passages of the voltage changes at the nodes N2, N3 and N5 and the voltage of the clock $\phi_1$ without a power source fluctuation, as compared with the broken lines N2, N3, N5 and $\phi_1$, which show the passages of the voltage changes at the same portions when the fluctuation occurs in the power supply.

The present invention is proposed in order to minimize the above-mentioned problems.

SUMMARY OF THE INVENTION

The object of the present invention is to provide a semiconductor circuit used as a buffer circuit in which the delay of the output clock caused by the fluctuation of the voltage of the power supply is improved and, thereby, the high speed access time is carried out by supplying a current leak circuit so that the charged voltages during a standby period are always maintained at the values corresponding to the voltage of the power source.

According to one aspect of the present invention, there is provided a semiconductor circuit used as a buffer circuit having an input stage circuit for receiving an input clock and an inverted input clock and having a node for providing an output, a bootstrap circuit, including a transistor, for receiving the output of said input stage circuit and for maintaining the gate voltage of the transistor at a high level during a standby period, and an output circuit including a transistor which is switched on and off by the output of the bootstrap circuit, for generating an output clock, the semiconductor circuit further comprising a current leak circuit for maintaining, during the standby period, the voltage of the node in the semiconductor circuit which is charged during the standby period at the value corresponding to the voltage of the power source.

According to another aspect of the present invention, there is provided a semiconductor circuit used as a buffer circuit, having an input stage delay circuit for receiving an input clock and an inverted input clock and including a node for providing an output, the node being charged during the standby period, a bootstrap circuit including a node, for receiving the output of the input stage delay circuit, the bootstrap circuit raising the voltage of the node with a bootstrap operation, and an output circuit for receiving the output of the bootstrap circuit for generating an output clock, the semiconductor circuit further comprising a current leak circuit connected between the node which connects the output of the input stage delay circuit with the input terminal of the bootstrap circuit and one of the output terminals of the power source, whereby, the voltage of the node in the semiconductor circuit which is charged during a standby period is always maintained during the standby period at the value corresponding to the voltage of the power source.

According to still another aspect of the present invention, there is provided a semiconductor circuit used as a buffer circuit having an input stage delay circuit for receiving an input clock and an inverted input clock and including a node for providing an output, the node being charged during a standby period, a bootstrap circuit including a node, for receiving the output of the input stage delay circuit, the bootstrap circuit raising the voltage of the node with a bootstrap operation, the bootstrap circuit including at least a first stage transistor and a second stage transistor, and an output circuit for receiving the output of the bootstrap circuit and for generating an output clock, the semiconductor circuit further comprising a current leak circuit connected between the node which connects the first stage transistor with the second stage transistor and one of the output terminals of the power source, whereby, the voltage of the node in the semiconductor circuit which is charged during the standby period is always maintained during the standby period at the value corresponding to the voltage of the power source.

According to still another aspect of the present invention, there is provided a semiconductor circuit used as a buffer circuit having an input stage delay circuit for receiving an input clock and an inverted input clock and including a node for providing an output, the node being charged during a standby period, a bootstrap circuit including a node, for receiving the output of the input stage delay circuit, the bootstrap circuit raising the voltage of the node with a bootstrap operation, the bootstrap circuit including at least a first transistor and a second transistor in a first stage and at least one transistor in a second stage, and an output circuit for receiving the output of the bootstrap circuit and for generating an output clock, the semiconductor circuit further comprising two current leak circuits, one of which connects a first node with one of the output terminals of the power source, which first node connects the first transistor and the second transistor in the first stage with the transistor in the second stage, and the other of which connects the second node with one of the output terminals of the power source, which second node connects the second transistor in the first stage with the output of the input stage delay circuit, whereby, the voltages of the nodes in the semiconductor circuit which are charged during a standby period are always maintained during the standby period at the value corresponding to the voltage of the power source.

DESCRIPTION OF THE PREFERRED EMBODIMENTS

Figure 1:
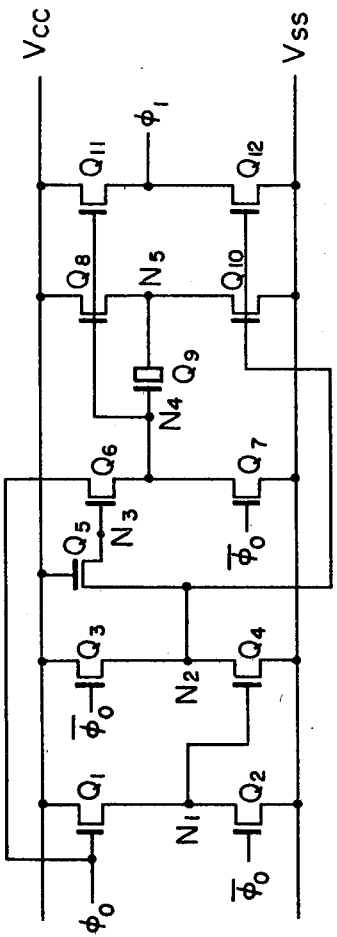
FIG. 1 shows a circuit diagram of an example of a conventional clock amplifier circuit.
Figure 2:
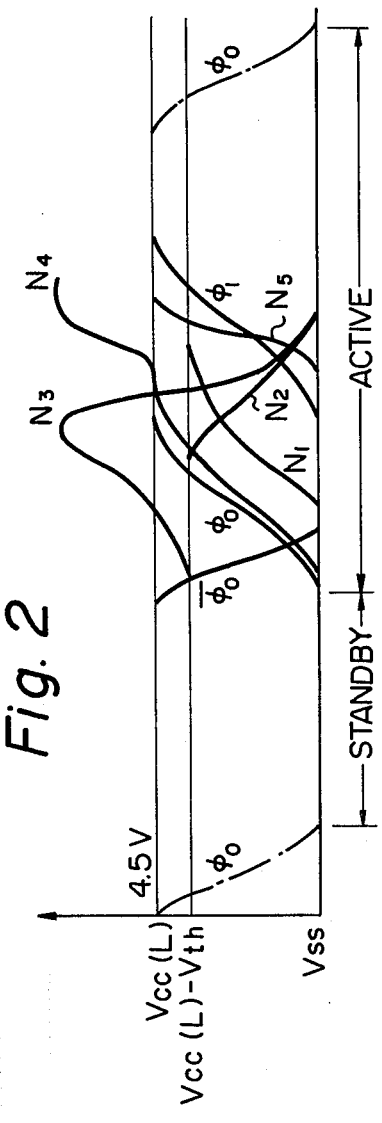
FIG. 2 and FIG. 3 are waveform diagrams of the circuit of FIG. 1.
Figure 3:
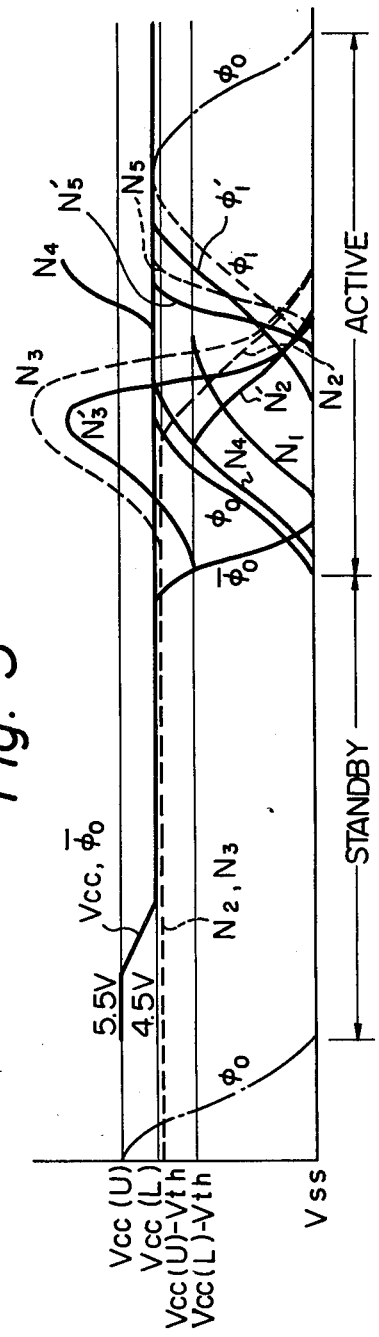
Figure 4:
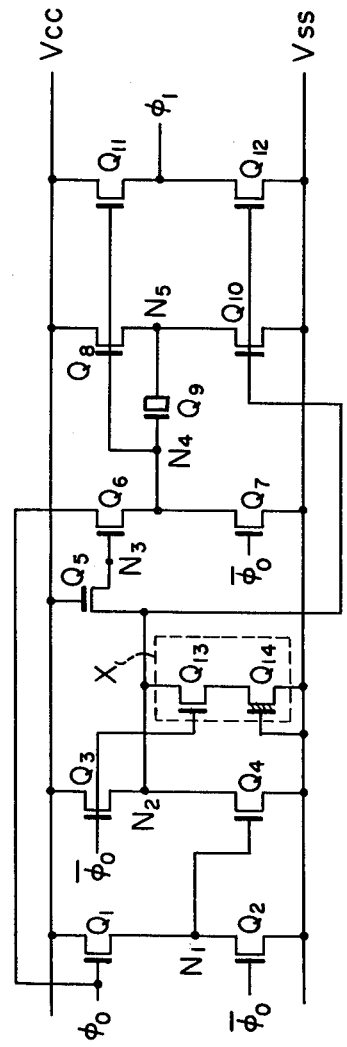
FIG. 4 shows a circuit diagram of a semiconductor circuit used as a buffer circuit according to a first embodiment of the present invention.
Figure 10:
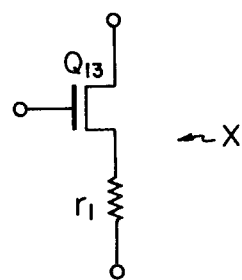
FIG. 10 (*a*), (*b*) and (*c*) are circuit diagrams showing various modified current leak circuits used for embodiments of the present invention.
Figure 10:
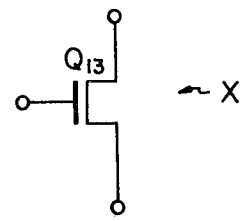
Figure 10:
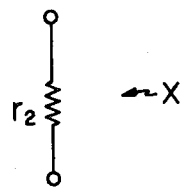

In FIG. 4, a circuit diagram of a semiconductor circuit used as a buffer circuit is shown, according to a first embodiment of the present invention, having a power source fluctuation compensating circuit (current leak circuit), as indicated by the reference mark X enclosed by broken line, which is not supplied in the FIG. 1. The circuit X consists of a series connection of an enhancement type MOS transistor Q13 for a leaking current turned on during a standby period and a depletion type MOS transistor Q14 for limiting the current; the circuit X is connected between the node N2 and the low voltage side Vss of the power source; and the node N2 is the connecting node between the transistor Q3, which turns on during the standby period and is used for charging, and the transistor Q4, which turns on during an active period and is used for discharging. In this example, although the "on" or "off" of the transistor Q13 is controlled by the clock $\overline{\phi_0}$, another signal which corresponds to the clock $\overline{\phi}_0$ in the IC can be used instead of the clock $\overline{\phi}_0$ for this purpose. Besides, the transistor Q14 can be turned into other electric current control elements, for example, a resistor r1 (FIG. 10(a)); further, the transistor Q14 can be omitted, if the conductive resistance of the transistor Q13 can be made high by adjusting the width/length of the channel thereof (FIG. 10(b)). Further, instead of transistors Q13 and Q14, a resistor r2 can be used (FIG. 10(c)). Namely, the functions required of the circuit X are to allow a small amount of current to leak during the standby period and to cause the voltages of nodes N2 and N3 to fall to the voltage of (Vcc−Vth) at that time.

Figure 5:
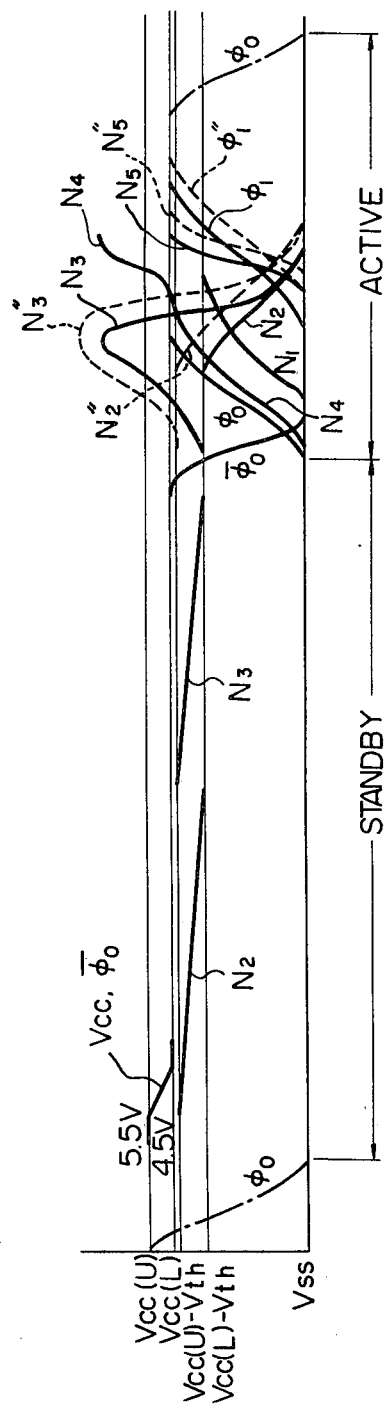
FIG. 5 is a waveform diagram of the circuit of FIG. 4.

When the above-mentioned power source fluctuation compensating circuit X is attached, the nodes N2 and N3 are charged at the beginning of the standby period to the voltage of (5.5 volts−Vth) through the voltage of Vcc which is equal to 5.5 volts; then, when the voltage of Vcc falls to the voltage of 4.5 volts, the charge on the node N2 is discharged through the circuit X until the voltage of the node N2 falls to the voltage of (4.5 volts−Vth), as shown in FIG. 5. In the above description the voltage of the node N2 falls, more specifically, to the voltage of (4.5 volts−Vth−ΔV); however, the voltage drop ΔV is negligible, and is caused due to the resistance of the transistor Q3 when the transistor Q3 turns on. When the voltage of the node N2 falls to the voltage of (4.5 volts−Vth−ΔV), the transistor Q5 turns on, the charge on the node N3 flows to the node N2, and the voltage of the node N3 changes to be equal to the voltage of (4.5 volts−Vth−ΔV) which is equal to the voltage of the node N2. Therefore, the effect of the decrease of Vcc from the voltage of 5.5 volts to 4.5 volts, namely the delay of the rising of the clock $\phi_1$, does not appear during the active period, if the voltage of Vcc changes from the voltage of 5.5 volts to 4.5 volts during the standby period. Since the current which flows through the circuit X is of very little quantity, the charging of the node N2 takes place without obstacles. In the circuit in which the clock $\overline{\phi}_0$ synchronizes with the clock $\phi_0$ and the falling of the clock $\overline{\phi}_0$ and the rising of the clock $\phi_1$ occurs simultaneously, the transistor 13 is not necessary. Namely, since the nodes N2 and N3 are charged through the transistor Q3, if the circuit X consists of only a resistance for leaking, the voltages of the nodes N2 and N3 can be held to the voltage of (Vcc−Vth) at that time. However, usually the clock $\overline{\phi}_0$ does not synchronize with the clock $\phi_0$; in some cases the clock $\overline{\phi}_0$ falls and after a while the clock $\phi_0$ rises. In this case, if the circuit X consists of only resistance for leaking, the voltages of the nodes N2 and N3 fall excessively between the falling time of the clock $\overline{\phi}_0$ and the rising time of the clock $\phi_0$; and, accordingly, the transistor Q13 is necessary. In order to compare this with the case of having no current leak circuit X, the waveforms in the case of having no current leak circuit X are shown in FIG. 5 with broken lines.

In the above-mentioned embodiment, it is assumed that the voltage of Vth of transistor Q3 is equal to the voltage of Vth of transistor Q5. In the above assumption, if the voltage of Vth of transistor Q5 is higher than that of Q3 because of the non-uniformity of the transistor characteristics during the manufacturing process, the transistor Q5 remains off, but nevertheless the voltage of the node N2 falls to the voltage of (Vcc−Vth−ΔV); then, although the voltage of the node N2 falls as above described, the voltage of the node N3 cannot fall. If the voltage of the node N3 is high, as mentioned above, the voltage of the node N3 rises higher during the active period, and then the rising of the output clock $\phi_1$ is delayed.

Figure 6:
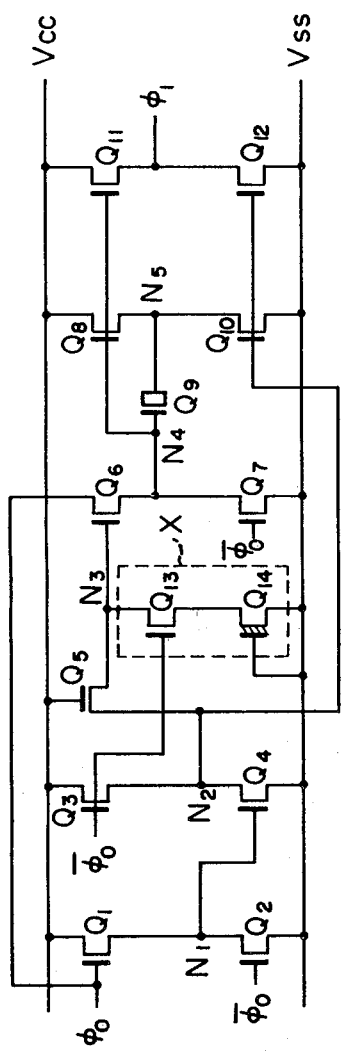
FIG. 6 shows a circuit diagram of a semiconductor circuit used as a buffer circuit according to a second embodiment of the present invention.

In FIG. 6, a semiconductor circuit used as a buffer circuit according to a second embodiment of the present invention is shown. In order to solve the above-mentioned problems, in the circuit in FIG. 6 the power source fluctuation compensating circuit (current leak circuit) is connected to the node N3. By using the power source fluctuation compensating circuit, the voltage of the node N3 can be the voltage of (Vcc−Vth).

Figure 7:
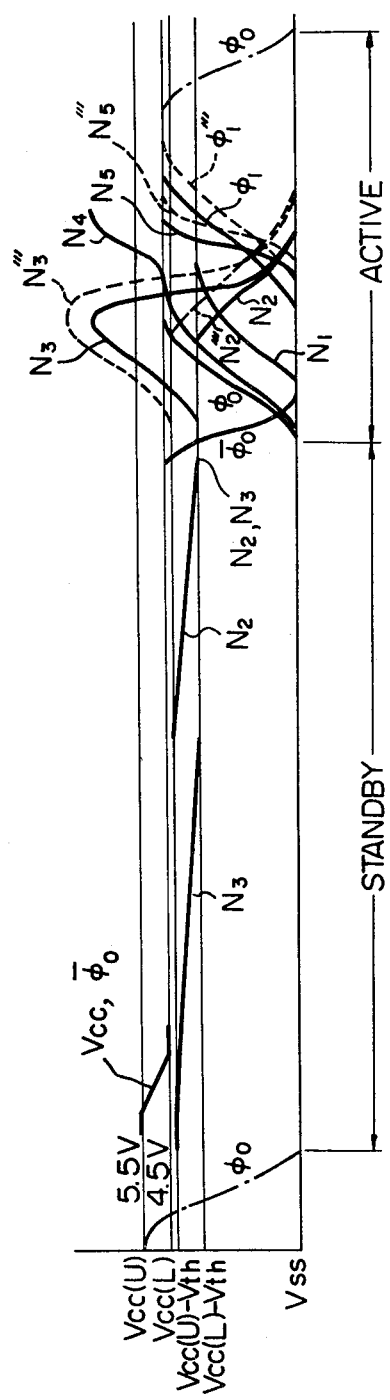
FIG. 7 is a waveform diagram of the circuit of FIG. 6.

In FIG. 7, the waveforms in operation of the circuit in FIG. 6 are shown. The voltage of the node N2 discharges through the transitor Q5 and the circuit X and falls to th voltage of (Vcc−Vth), the value of which is similar to the node N3. The waveforms in the circuit in FIG. 6, produced without the circuit X, are shown by the broken lines in FIG. 7, which can be compared with the solid lines which indicates the waveforms of the circuit in FIG. 6 produced with the circuit X. While, if the circuit X is connected at the node N3, as shown in the second embodiment, the electrostatic capacity of the node N3 increases and the bootstrap effect is interrupted at the rising time of the clock $\phi_0$ and then the increase of the voltages of the nodes N3 and N4 is interrupted.

Figure 8:
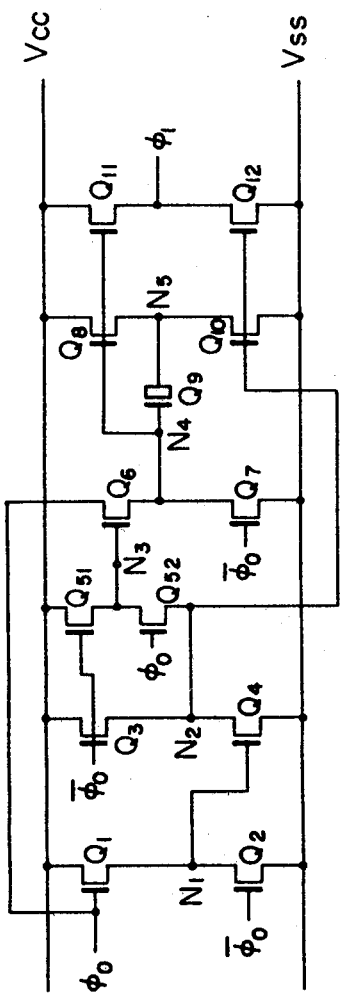
FIG. 8 shows a circuit diagram of another example of a conventional clock amplifier circuit.

In FIG. 8, another example of the clock amplifier circuit using two transistors Q51 and Q52, instead of the transistor Q5 in FIG. 1. In this circuit, during the standby period, since the clock $\overline{\phi}_0$ is a high level, the transistor Q3 turns on, the voltage of the node N2 is the voltage of (Vcc−Vth), the transistor Q51 turns on and the voltage of the node N3 is the voltage of (Vcc−Vth). Then, since the voltage of the clock $\phi_0$ is a low level, the transistor Q52 turns off and the node N2 is separated from the node N3. During the active period, since the voltage of the clock $\phi_0$ is a high level, the transistor Q52 turns on and the circuit in FIG. 8 operates similarly as the circuit of FIG. 1. Also, in the case in which the voltage of Vcc changes before the active period, the voltages of the nodes N2 and N3 remain at an excessively high condition. In this circuitry, if the power source fluctuation compensating circuit is connected to either the node N2 or the node N3, since the transistor Q52 is off during the standby period, when the voltage of the power source changes, the voltage of the node to which the power source fluctuation compensating circuit is not supplied remains at a high voltage.

Figure 9:
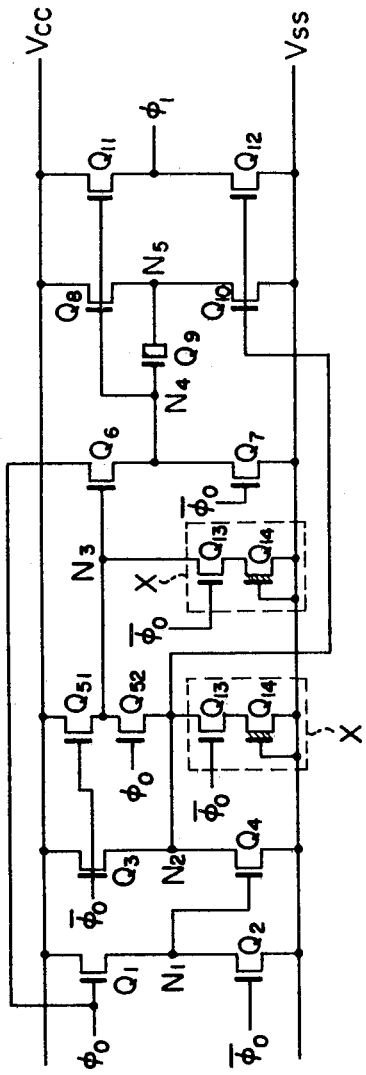
FIG. 9 shows a circuit diagram of a semiconductor circuit used as a buffer circuit according to a third embodiment of the present invention.

In order to solve the above-mentioned problem, a semiconductor circuit use as a buffer circuit is proposed, according to a third embodiment of the present invention, as shown in FIG. 9. In this circuit, two of the power source fluctuation compensating circuits X and X are connected between the node N2 and Vss and between the node N3 and Vss, respectively. Below, the cases are explained in which the voltage of the power source is fixed at 5.5 volts and in which the voltage of the power source rises up from 4.5 volts to 5.5 volts.

In the case in which the voltage of the power source is 5.5 volts, generally, at the high voltage of the power source, the mutual conductance gm increases; then the operating speed increases and there is no bad influence. Below, the explanation is given referring to FIG. 1. When the voltage of the power source Vcc is high, the voltages of the nodes N2 and N3 are high and the high level of the clock $\phi_0$ rises higher; then the voltage of the node N1 rises higher and the gm of the transistor Q4 is higher than the gm of the transistor Q4 at the low voltage of Vcc. Since the gm of the transistor Q4 is high, the discharging speed on the nodes N2 and N3 is high.

Now the case will be described in which the voltage of the power source rises up from 4.5 volts to 5.5 volts. When the voltage of Vcc rises from 4.5 volts to 5.5 volts, the voltage of the clock $\bar{\phi}_0$ rises from 4.5 volts to 5.5 volts. The following facts are the reason why the voltage of the clock $\bar{\phi}_0$ changes from 4.5 volts to 5.5 volts. Namely, the clock $\bar{\phi}_0$ generates from the similar circuit as shown in FIG. 1, and when the voltage of Vcc is 4.5 volts and the voltage of the clock $\phi_1$ is a high level (4.5 volts), the voltage of the node N4 is more than (Vcc+Vth) i.e. (4.5 volts+Vth). Also, the voltage of the node N5 is the voltage of Vcc. In this case, when the voltage of Vcc rises from 4.5 volts to 5.5 volts, the voltage of the node N5 rises from 4.5 volts to 5.5 volts through the transistor Q8, and since the voltage of the node N5 rises up the voltage of the node N4 through the transistor Q9, though the voltage of Vcc rises up to 5.5 volts, the voltage of node N4 rises to the voltage of more than the voltage of (Vcc+Vth), i.e. (5.5 volts+Vth), and the voltage of the clock $\phi_1$ rises to 5.5 volts.

After the voltage of Vcc rises from 4.5 volts to 5.5 volts, the voltage of the nodes N2 and N3 are equal to the voltage of the nodes when the voltage of Vcc is fixed at 5.5 volts; therefore, there is no delay at the operating time.

We claim:

1. A semiconductor circuit, having first and second power terminals respectively connectable to receive a power source voltage and a reference voltage, and used as a buffer circuit for providing an output clock signal in response to an input clock signal and an inverted input clock signal, comprising:

an input stage circuit, operatively connected to receive the input clock signal and the inverted input clock signal, for generating an output signal at a node in response thereto, the node being charged and maintained at the power source voltage during a standby period in which the input clock signal has a voltage lower than the voltage of the inverted input clock signal;

a bootstrap circuit, operatively connected to said input stage circuit, for generating a boosted signal in response to the output signal of said input stage circuit, said bootstrap circuit including a first field effect transistor operatively connected to the node, for receiving the output signal of said input stage circuit;

an output circuit, operatively connected to said bootstrap circuit, for generating the output clock signal, said output circuit including a second field effect transistor operatively connected to said bootstrap circuit for receiving the boosted signal; and a current leak circuit operatively connected between the node of said input stage circuit and said second power terminal, for maintaining the voltage of the node being charged during the standby period at a value corresponding to the power source voltage, by leaking excess charges at the node to lower the voltage level of the node.

2. A semiconductor circuit, having first and second power terminals respectively connectable to receive a power source voltage and a reference voltage, and used as a buffer circuit for providing an output clock signal in response to an input clock signal and an inverted input clock signal, comprising:

an input stage delay circuit, operatively connected to receive the input clock signal and the inverted input clock signal, for generating an output signal at a node in response thereto, the node being charged and maintained at the power source voltage during a standby period in which the input clock signal has a voltage lower than the voltage of the inverted input clock signal;

a bootstrap circuit, operatively connected to said input stage delay circuit, for responding to the voltage of the node after the standby period by outputting a boosted signal;

an output circuit, operatively connected to said bootstrap circuit, for receiving the boosted signal of said bootstrap circuit and for generating the output clock signal; and a current leak circuit, operatively connected between said input stage delay circuit and said second power terminal, for maintaining the voltage of the node being charged during the standby period at a value corresponding to the power source voltage by leaking excess charges at the node to lower the voltage level of the node.

3. A semiconductor circuit, having first and second power terminals respectively connectable to receive a power source voltage and a reference voltage, and used as a buffer circuit for providing an output clock signal in response to an input clock signal and an inverted input clock signal, comprising:

an input stage circuit including an input delay circuit, operatively connected to receive the input clock signal and the inverted input clock signal, for generating an output signal at a node, the node being charged and maintained at the power source voltage during the standby period in which the input clock signal has a voltage level lower than the voltage level of the inverted input clock signal;

a bootstrap circuit, operatively connected to said input delay circuit, for responding to the voltage of the node by generating a boosted signal in response to the output signal of said input delay circuit, said bootstrap circuit including at least a first stage transistor and a second stage transistor operatively connected to said first stage transistor at a second node;

an output circuit, operativley connected to said bootstrap circuit, for receiving the boosted signal and for generating the output clock signal; and a current leak circuit, operatively connected between said second node and said second power terminal, for maintaining the voltage of said second node being charged during the standby period at a value corresponding to the power source voltage, by leaking excess charges at the node to lower the voltage level of the node.

4. A semiconductor circuit, having first and second power terminals respectively connectable to receive a power source voltage and a reference voltage, and used as a buffer circuit for providing an output clock signal in response to an input clock signal and an inverted input clock signal, comprising:

an input stage circuit including an input delay circuit, operatively connected to receive the input clock signal and the inverted input clock signal, for generating an output signal at a first node in response thereto, the first node being charged and maintained at the power source voltage during a standby period in which the input clock signal has a voltage level lower than a voltage level of the inverted input clock signal;

a bootstrap circuit, operatively connected to said input delay circuit, for generating a boosted signal in response to the output signal of said input delay circuit, said bootstrap circuit including a first stage having at least a first transistor and a second transistor operatively connected to said first transistor at a second node, and a second stage having a third transistor operatively connected to said first and second transistors at the second node;

an output circuit, operatively connected to said bootstrap circuit, for receiving the boosted signal and for generating the output clock signal; and first and second current leak circuits, said first current leak circuit operatively connected to the second node between said first and second transistors in said first stage and said second power terminal, said second current leak circuit operatively connected between the first node of said input delay circuit and said second power terminal, the voltages of the first and second nodes being maintained at a value corresponding to the power source voltage by leaking excess charges at the first and second nodes to lower the voltage level of the first and second nodes.

5. A semiconductor circuit used as a buffer circuit as defined in claim 1, 2, 3 or 4, wherein said current leak circuit comprises field effect transistors operatively connected in series.

6. A semiconductor circuit used as a buffer circuit as defined in claim 1, 2, 3 or 4, wherein said current leak circuit comprises a field effect transistor, and a resistor operatively connected in series with said field effect transistor.

7. A semiconductor circuit used as a buffer circuit as defined in claim 1, 2, 3 or 4, wherein said current leak circuit comprises a field effect transistor.

8. A semiconductor circuit used as a buffer circuit as defined in claim 1, 2, 3 or 4, wherein said current leak circuit comprises a resistor.

* * * * *

UNITED STATES PATENT AND TRADEMARK OFFICE
CERTIFICATE OF CORRECTION

PATENT NO. : 4,447,745  Page 1 of 2

DATED : May 8, 1984

INVENTOR(S) : YOSHIHIRO TAKEMAE ET AL.

It is certified that error appears in the above-identified patent and that said Letters Patent is hereby corrected as shown below:

```
          [57] ABSTRACT
               line 15, "of" (second occurrence) should be
                        --by--;
               line 16, "by" should be --of--.

Col. 2, line 18, after "than" insert --the voltage of--;
        line 25, after "and" insert --the--;
        line 38, "volt" should be --volts--.

Col. 3, line 26, delete ",".

Col. 4, line 56, after "by" insert --the--;
        line 56, "the FIG." should be --FIG.--.
```

UNITED STATES PATENT AND TRADEMARK OFFICE
CERTIFICATE OF CORRECTION

PATENT NO. : 4,447,745

DATED : MAY 8, 1984

INVENTOR(S) : YOSHIHIRO TAKEMAE ET AL.

It is certified that error appears in the above-identified patent and that said Letters Patent is hereby corrected as shown below:

Col. 6, line 16, "th" should be --the--;
       line 52, "use" should be --used--;
       line 57, begin a new paragraph with "Below,".

Col. 7, line 50, after "transistor" insert --,--.

Col. 8, line 56, change "the node" to --said second node--;
       line 57, change "the node" to --said second node--.

Signed and Sealed this

Fifth Day of March 1985

[SEAL]

Attest:

DONALD J. QUIGG

Attesting Officer     Acting Commissioner of Patents and Trademarks